United States Patent
Cheng et al.

(10) Patent No.: US 10,763,794 B2
(45) Date of Patent: Sep. 1, 2020

(54) HARMONIC COMPENSATION DEVICE

(71) Applicant: REALTEK SEMICONDUCTOR CORPORATION, Hsinchu (TW)

(72) Inventors: Chung-Chieh Cheng, New Taipei (TW); Yi-Chang Tu, New Taipei (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/460,227

(22) Filed: Jul. 2, 2019

(65) Prior Publication Data
US 2020/0144972 A1 May 7, 2020

(30) Foreign Application Priority Data

Nov. 5, 2018 (TW) ................. 107139104 A (51) Int. Cl.
| | |
|---|---|
| *H03F 1/32* | (2006.01) |
| *H03F 3/24* | (2006.01) |
| *H03M 1/66* | (2006.01) |
| *H04B 1/04* | (2006.01) |

(52) U.S. Cl.
CPC ............ *H03F 1/3247* (2013.01); *H03F 3/24* (2013.01); *H03M 1/66* (2013.01); *H04B 1/0475* (2013.01)

(58) Field of Classification Search
CPC ........ H03F 1/3247; H03F 3/24; H03F 1/3241; H03F 1/3223; H03F 1/3229; H03M 1/66; H04B 2001/0433; H04B 2001/0425; H04B 1/0475
See application file for complete search history.

(56) References Cited

U.S. PATENT DOCUMENTS

| | | | |
|---|---|---|---|
| 6,178,309 B1* | 1/2001 | Mizoguchi | H03G 3/3042 455/138 |
| 7,469,491 B2 | 12/2008 | McCallister et al. | |
| 7,561,636 B2 | 7/2009 | Song et al. | |
| 10,320,411 B1* | 6/2019 | Zhang | H03M 1/66 |
| 2005/0227628 A1* | 10/2005 | Inanoglu | H04B 17/21 455/68 |
| 2012/0224653 A1* | 9/2012 | Lozhkin | H03F 1/3294 375/297 |

(Continued)

OTHER PUBLICATIONS

Taiwan Intellectual Property Office, Office Action issued in counterpart TW application No. 107139104 dated Apr. 29, 2019. English summary on p. 1.

*Primary Examiner* — Sophia Vlahos
(74) *Attorney, Agent, or Firm* — WPAT, PC (57) ABSTRACT

Disclosed is a harmonic compensation device capable of effectively reducing the harmonic distortion of an analog output signal. The harmonic compensation device includes a harmonic compensator, a mixer, a digital-to-analog converter, and an analog output circuit. The harmonic compensator is configured to generate a digital compensation signal according to a digital input signal, in which the digital compensation signal includes the harmonic components of the digital input signal. The mixer is configured to generate a digital output signal according to the digital input signal and the digital compensation signal. The digital-to-analog converter is configured to generate an analog input signal according to the digital output signal. The analog output circuit is configured to generate an analog output signal according to the analog input signal.

17 Claims, 7 Drawing Sheets

400

(56) References Cited

U.S. PATENT DOCUMENTS

| | | | |
|---|---|---|---|
| 2013/0064325 A1* | 3/2013 | Kilambi | H03F 1/3247 |
| | | | 375/297 |
| 2015/0071338 A1* | 3/2015 | Talwalkar | H04L 27/36 |
| | | | 375/238 |
| 2015/0072632 A1* | 3/2015 | Pourkhaatoun | H03F 3/245 |
| | | | 455/127.2 |
| 2017/0149459 A1* | 5/2017 | Ohta | H04B 1/0475 |
| 2018/0054224 A1* | 2/2018 | Nammi | H04B 1/0475 |
| 2018/0183469 A1* | 6/2018 | Arnold | H04B 1/0475 |

\* cited by examiner

HARMONIC COMPENSATION DEVICE

BACKGROUND OF THE INVENTION

1. Field of the Invention

The present invention relates to a compensation device, especially to a harmonic compensation device.

2. Description of Related Art

An operational amplifier (OP) is often used in an analog circuit. However, if a signal inputted to an OP is very weak or very strong, the voltage difference between the input terminals of the OP could be too great and the OP might work in a saturation region (a.k.a. non-linear region); this will cause the output signal of the OP to include harmonic components and lead to the problem of harmonic distortion.

SUMMARY OF THE INVENTION

An object of the present invention is to provide a harmonic compensation device capable of reducing the harmonic distortion of an analog output signal.

An embodiment of the harmonic compensation device of the present invention is designed to generate harmonic waves in a digital domain and then use the harmonic waves to offset harmonic distortion generated in an analog domain. The embodiment includes a harmonic compensator, a conversion circuit, and an analog output circuit. The harmonic compensator is configured to generate a digital compensation signal according to a digital input signal, in which at least one parameter of the harmonic compensator is fixed or adjustable and the digital compensation signal includes harmonic components of the digital input signal to cause harmonic predistortion. The conversion circuit is configured to generate an analog input signal according to the digital input signal and the digital compensation signal; for instance, the conversion circuit includes a mixer and a digital-to-analog converter, the mixer is configured to generate a digital output signal according to the digital input signal and the digital compensation signal, and the digital-to-analog converter is configured to generate the analog input signal according to the digital output signal. The analog output circuit is configured to generate an analog output signal according to the analog input signal while the harmonic distortion of the analog output signal is offset or reduced by the aforementioned harmonic predistortion.

Another embodiment of the harmonic compensation device further includes a measuring circuit configured to measure the harmonic distortion of the analog output signal and thereby generate at least one adjustment signal for the determination of the at least one parameter of the harmonic compensator. In this embodiment, the harmonic compensation device is an integrated circuit.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present invention discloses a harmonic compensation device capable of generating harmonic waves according to a digital input signal and thereby using the harmonic waves to offset or reduce harmonic components of an analog output signal that is generated according to the digital input signal by an analog circuit.

Figure 1:
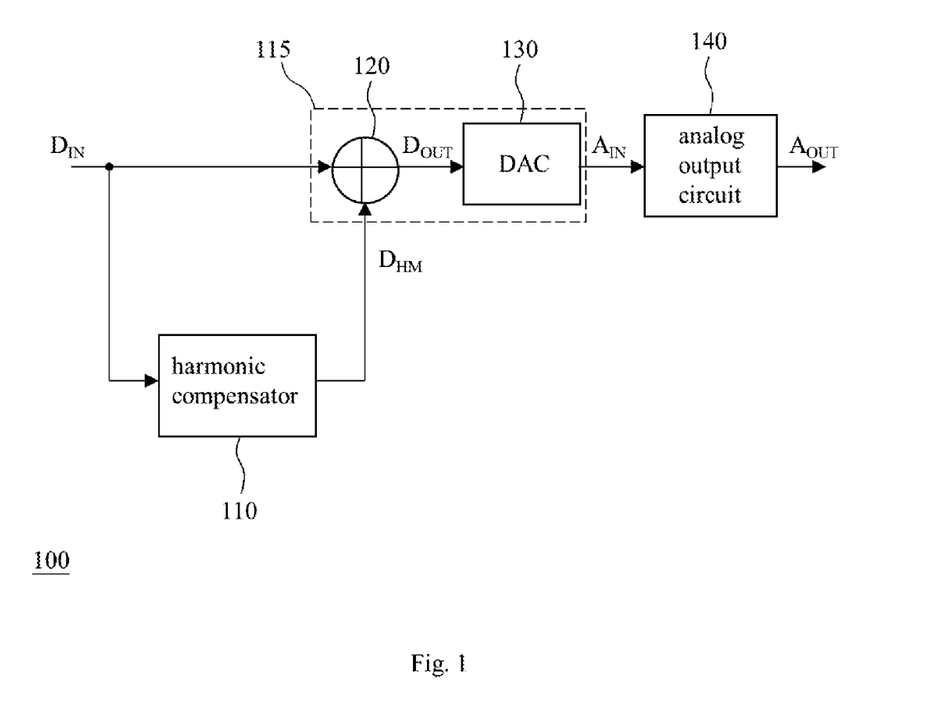
FIG. 1 shows an embodiment of the harmonic compensation device of the present invention.

FIG. 1 shows an embodiment of the harmonic compensation device of the present invention. The harmonic compensation device 100 of FIG. 1 includes a harmonic compensator 110, a mixer 120, a digital-to-analog converter (DAC) 130, and an analog output circuit 140, in which the mixer 120 and the digital-to-analog converter 130 are included in a conversion circuit 115.

Please refer to FIG. 1. The harmonic compensator 110 is configured to generate a digital compensation signal $D_{HM}$ according to a digital input signal $D_N$. An instance of the digital input signal $D_N$ is a single-frequency signal such as a signal originated from a wireless communication device (e.g., WLAN device or Bluetooth device) or an audio device. The digital compensation signal $D_{HM}$ includes the harmonic components of the digital input signal $D_N$. At least one parameter of the harmonic compensator 110 is fixed or adjustable; if the at least one parameter of the harmonic compensator 110 is fixed for a determined non-linear influence and the digital input signal $D_N$ keeps unchanged, the digital compensation signal $D_{HM}$ has no need to vary with the analog output signal $A_{OUT}$ of the analog output circuit 140; and if the at least one parameter of the harmonic compensator 110 is adjustable for a to-be-determined non-linear influence and the digital input signal $D_{IN}$ keeps unchanged, the at least one parameter can optionally vary with the analog output signal $A_{OUT}$ of the analog output signal 140 for the adjustment of the digital compensation signal $D_{HM}$. The detail of the harmonic compensator 110 is described in a later paragraph.

Please refer to FIG. 1. The mixer 120 is configured to generate a digital output signal $D_{OUT}$ according to the digital input signal $D_N$ and the digital compensation signal $D_{HM}$. In an exemplary implementation of the embodiment of FIG. 1, the harmonic compensator 110 reverses the harmonic waves of the digital compensation signal $D_{HM}$ before it is outputted so that the mixer 120 can add up the digital input signal $D_N$ and the digital compensation signal $D_{HM}$ to generate the digital output signal $D_{OUT}$ with harmonic predistortion. In another exemplary implementation of the embodiment of FIG. 1, the harmonic compensator 110 does not reverse the harmonic waves of the digital compensation signal $D_{HM}$ so that the mixer 120 can subtract the digital compensation signal $D_{HM}$ from the digital input signal $D_N$ to generate the digital output signal $D_{OUT}$ with harmonic predistortion. Since the above-mentioned reverse operation and the mixer 120 can be realized with a known or self-developed technique, their details are omitted here.

Please refer to FIG. 1. The DAC 130 is configured to generate an analog input signal $A_N$ according to the digital output signal $D_{OUT}$. Since the DAC 130 includes analog circuits which may induce non-linear influences, when the digital input signal $D_N$ is very strong or very weak, the analog input signal $A_N$ generated by the DAC 130 may include harmonic components providing there are no compensation signals; however, because of the effect of the digital compensation signal $D_{HM}$ the harmonic components of the analog input signal $A_N$ can be offset or reduced.

Please refer to FIG. 1. The analog output circuit 140, which may induce non-linear influences, is configured to generate an analog output signal $A_{OUT}$ according to the analog input signal $A_{IN}$. Providing the digital output signal $D_N$ is very strong or very weak, the analog output signal $A_{OUT}$ generated by the analog output circuit 140 may include harmonic components if there is no compensation signals; however, as a result of the effect of the digital compensation signal $D_{HM}$, the harmonic components of the analog output signal $A_{OUT}$ are offset or reduced. In an exemplary implementation of the embodiment of FIG. 1, at least one of the DAC 130 and the analog output circuit 140 includes an electronic device (e.g., operational amplifier). When the electronic device works in a non-linear region or induces a non-linear influence, it will be the cause of the harmonic distortion of the analog output signal $A_{OUT}$.

Figure 2:
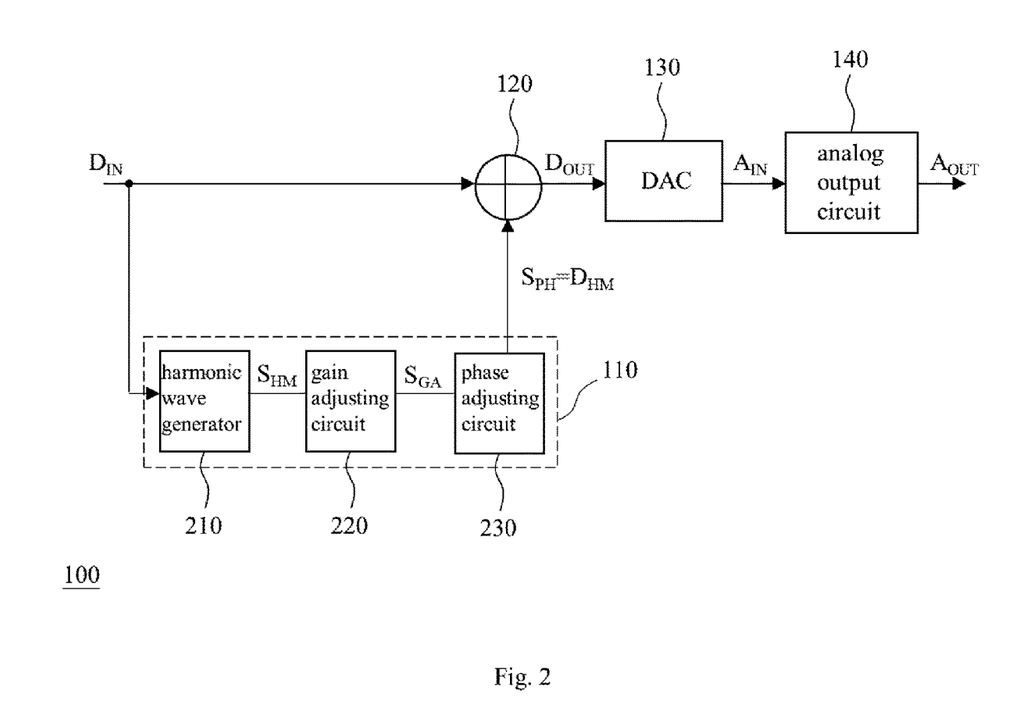
FIG. 2 shows an embodiment of the harmonic compensator of FIG. 1.

FIG. 2 shows an embodiment of the harmonic compensator 110 of FIG. 1. As shown in FIG. 2, the harmonic compensator 110 includes a harmonic wave generator 210, a gain adjusting circuit 220, and a phase adjusting circuit 230. The harmonic wave generator 210 is configured to generate K harmonic waves $S_{HM}$ according to the digital input signal $D_N$, in which a frequency of each of the K harmonic waves $S_{HM}$ is N times a frequency of the digital input signal $D_{IN}$, the K is a positive integer (e.g., integer larger than one), and the N of each of the K harmonic waves $S_{HM}$ is a positive value related to the harmonic wave type(s) (e.g., the type of integer-multiple harmonic, the type of non-integer-multiple harmonic, the type of sub-harmonic) of the K harmonic waves $S_{HM}$. For instance, if the frequency of the digital input signal $D_{IN}$ is 1 Khz and all the types of the K harmonic waves $S_{HM}$ are the type of integer-multiple harmonic, the K harmonic waves will be the harmonic wave of 2 KHz (i.e., two times the frequency of $D_{IN}$), the harmonic wave of 3 KHz (i.e., three times the frequency of $D_{IN}$), the harmonic wave of 4 KHz (i.e., four times the frequency of $D_{IN}$), and so on and so forth, in which the number of the K is determined according to the demand for implementation. In an exemplary implementation of the embodiment of FIG. 2, the harmonic wave generator 210 processes the digital input signal $D_{IN}$ with a square operation, a cube operation, and etc. and thereby generates the K harmonic waves $S_{HM}$. Since the technique of generating harmonic waves according to a give digital signal is a known or self-developed technique, the detail is omitted here.

Figure 3:
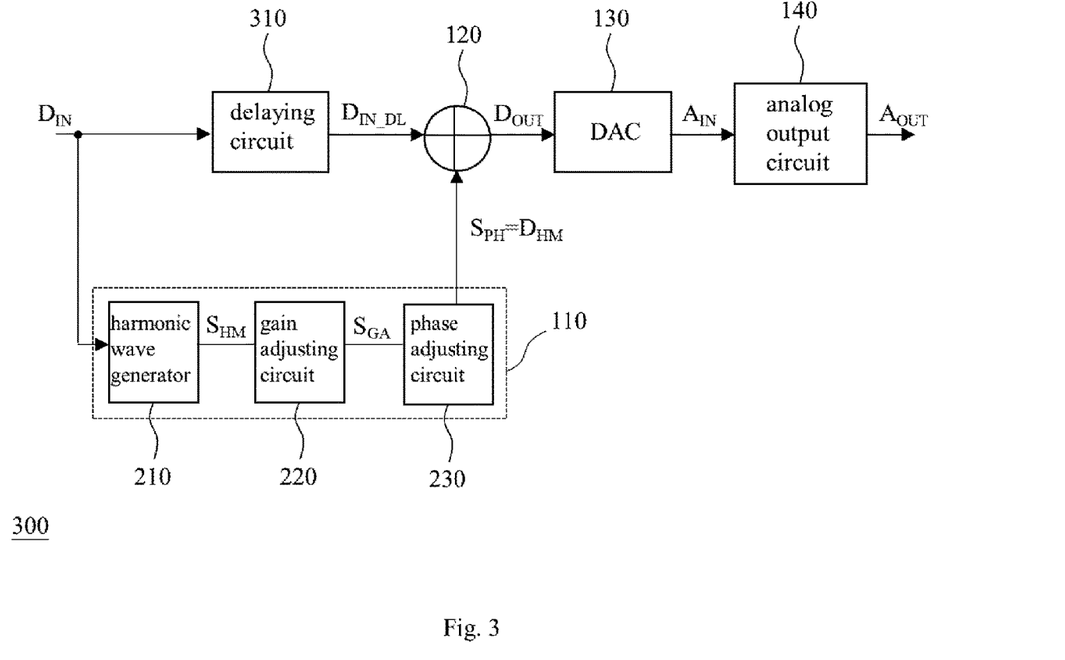
FIG. 3 shows another embodiment of the harmonic compensation device of the present invention.

Please refer to FIG. 2. The gain adjusting circuit 220 is configured to adjust the gains of the K harmonic waves $S_{HM}$ and thereby generate K gain-adjusted harmonic waves $S_{GA}$; if there is no need to adjust the gains of the K harmonic waves SHM, the parameter(s) of the gain adjusting circuit 220 for the adjustment of the gains of the K harmonic waves $S_{HM}$ is/are kept unchanged. The phase adjusting circuit 230 is configured to adjust the phases of the K gain-adjusted harmonic waves $S_{GA}$ and thereby generate K phase-adjusted harmonic waves $S_{PH}$ as the digital compensation signal $D_{HM}$; if there is no need to adjust the phases of the K gain-adjusted harmonic waves $S_{GA}$, the parameter(s) of the phase adjusting circuit 230 for the adjustment of the phase of the K gain-adjusted harmonic waves $S_{GA}$ is/are kept unchanged. At least one parameter of each of the gain adjusting circuit 220 and the phase adjusting circuit 230 is fixed or adjustable. In an exemplary implementation of the embodiment of FIG. 2, the parameters of the gain adjusting circuit 220 and the phase adjusting circuit 230 are fixed parameters; in this case, the fixed parameters can be determined by an external measuring circuit or an internal measuring circuit (e.g., the measuring circuit 410 of FIG. 4), each of which adjusts the parameters of the gain adjusting circuit 220 and the phase adjusting circuit 230 at least one time and measures the strength of the harmonic components of the analog output signal $A_{OUT}$ for the determination of the parameters. For instance, the external measuring device is used for the determination of the fixed parameters when the strength of the harmonic components of the analog output signal $A_{OUT}$ is lower than a threshold which is determined according to the demand for implementation. In another exemplary implementation of the embodiment of FIG. 2, at least some parameters of the gain adjusting circuit 220 and the phase adjusting circuit 230 are adjustable parameters; in this case, the adjustable parameters are determined by an internal measuring circuit (e.g., the measuring circuit 410 of FIG. 4) according to the strength of the harmonic components of the analog output signal $A_{OUT}$; more specifically, the internal measuring circuit continually adjusts the adjustable parameters till the strength of the harmonic components of the analog output signal $A_{OUT}$ is lower than a threshold which is determined according to the demand for implementation. It should be noted that the aforementioned external measuring device is not included in the harmonic compensation device of the present invention.

FIG. 3 shows another embodiment of the harmonic compensation device of the present invention. In comparison with FIG. 2, the harmonic compensation device 300 of FIG. 3 further includes a delaying circuit 310. The delaying circuit 310 is configured to neutralize the transmission delay caused by the harmonic compensator 110 so as to allow the digital input signal $D_{IN}$ of a certain time point and the digital compensation signal $D_{HM}$ originated from the digital input signal $D_{IN}$ of the certain time point can reach the mixer 120 at the same time. In FIG. 3, the delaying circuit 310 is configured to delay the digital input signal $D_{IN}$ and thereby output a delayed digital input signal $D_{IN\_DL}$ to the mixer 120, in which the delay amount of the delaying circuit 310 is determined according to the transmission delay caused by the harmonic compensator 110. For instance, if the transmission delay caused by the harmonic compensator 110 is equal to the length of X period(s) of a reference clock, the delay amount of the delaying circuit 310 is set in accordance with the length of the X period(s); for instance, the delay amount is set to be equal to the sum of the X period(s) of the reference clock, the reference clock is the working clock of the harmonic compensator 110 or any clock that can be used for measuring the transmission delay, the number X is a positive integer, and the transmission delay (i.e., the length of the X period(s)) is determined with a known or self-developed simulation and analysis tool, external equipment, or a clock counter.

It should be noted that the delaying circuit 310 of FIG. 3 can take the place of the phase adjusting circuit 230. More specifically, since both the delaying circuit 310 and the phase adjusting circuit 230 are used for the adjustment of the phase relation between the digital input signal $D_{IN}$ and the digital compensation signal $D_{HM}$, the phase adjustment generated by the phase adjusting circuit 230 can be realized with the delaying circuit 310 instead; in this case, the phase adjusting circuit 230 can optionally be omitted and the K gain-adjusted harmonic waves $S_{GA}$ or the equivalents thereof are treated as the digital compensation signal $D_{HM}$. It should also be noted that as long as the delay amount generated by the delaying circuit 310 can be realized with the phase adjusting circuit 230, the delaying circuit 310 can optionally be omitted.

Figure 4:
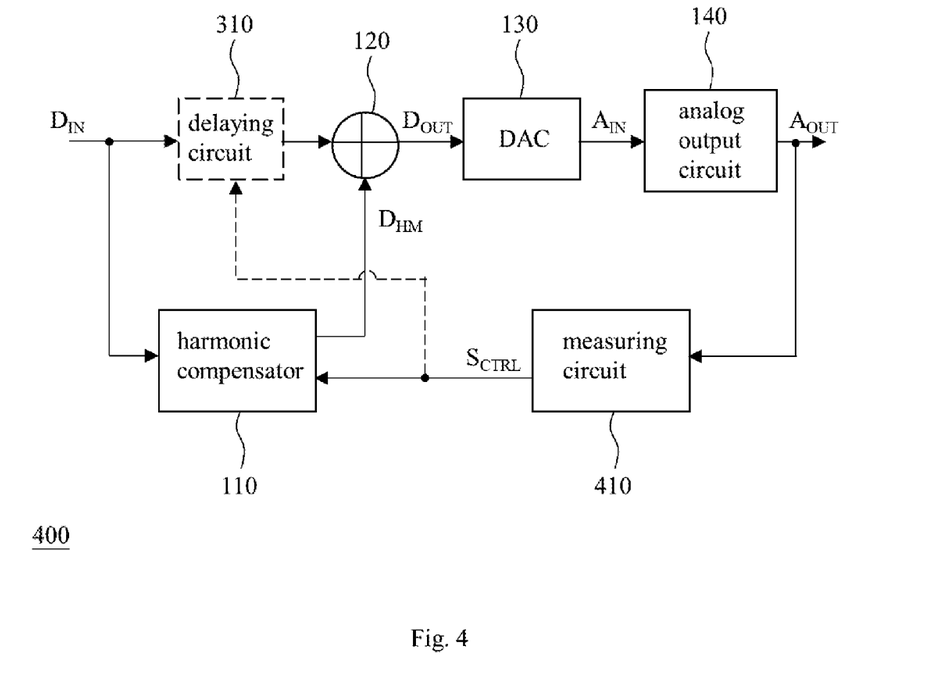
FIG. 4 shows yet another embodiment of the harmonic compensation device of the present invention.

FIG. 4 shows another embodiment of the harmonic compensation device of the present invention. In comparison with FIG. 1, the harmonic compensation device 400 of FIG. 4 includes a measuring circuit 410 and optionally includes the delaying circuit 310 which is shown with a dashed block. The measuring circuit 410 is configured to measure the harmonic distortion of the analog output signal $A_{OUT}$ and thereby generate at least one adjustment signal $S_{CTRL}$ used for the setting of at least one parameter of the harmonic compensator 110 and optionally used for the setting of the delay amount of the delaying circuit 310. In this embodiment, the harmonic compensation device 400 and the circuits therein are integrated circuits. In an exemplary implementation of this embodiment, the at least one adjustment signal $S_{CTRL}$ includes a gain adjustment signal and a phase adjustment signal that are used for the setting of at least one parameter of the gain adjusting circuit 220 of FIG. 2 and the setting of at least one parameter of the phase adjusting circuit 230 of FIG. 2 respectively. In another exemplary implementation of this embodiment, the at least one adjustment signal $S_{CTRL}$ includes a gain adjustment signal and a phase adjustment signal that are used for the setting of the at least one parameter of the gain adjusting circuit 220 of FIG. 3 and the delay amount of the delaying circuit 310 of FIG. 3.

Figure 5:
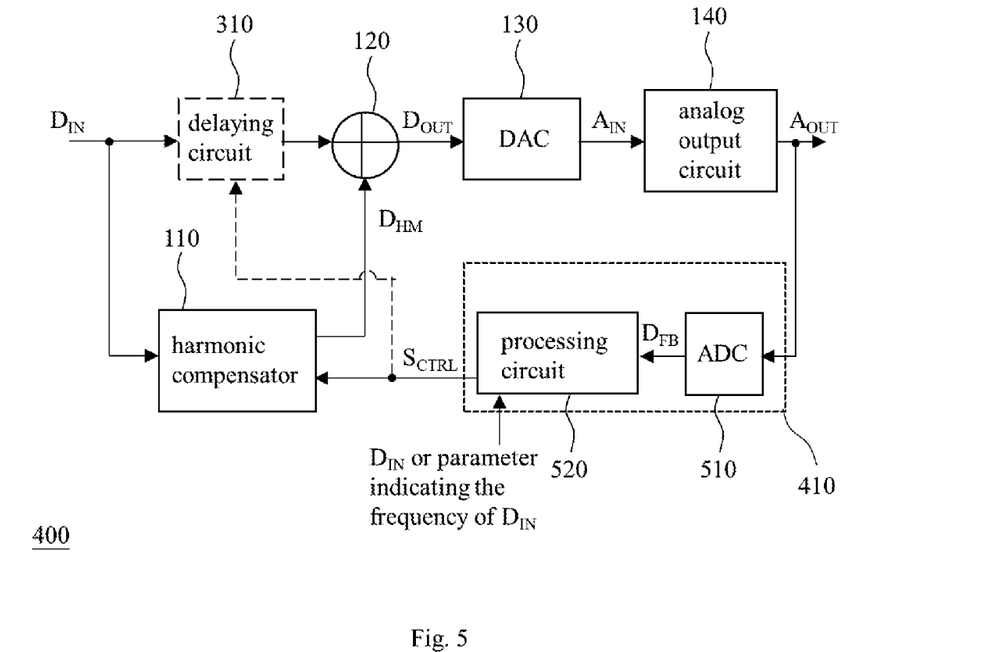
FIG. 5 shows an embodiment of the measuring circuit of FIG. 4.

FIG. 5 shows an embodiment of the measuring circuit 410 of FIG. 4. As shown in FIG. 5, the measuring circuit 410 includes an analog-to-digital converter (ADC) 510 and a processing circuit 520. The ADC 510 is configured to generate a digital feedback signal $D_{FB}$ according to the analog output signal $A_{OUT}$. The processing circuit 520 is configured to generate the at least one adjustment signal $S_{CTRL}$ according to the digital feedback signal $D_{FB}$ and the digital input signal $D_{IN}$. In an exemplary implementation of this embodiment, the processing circuit 520 includes a mixer configured to subtract the digital input signal $D_{IN}$ from the digital feedback signal $D_{FB}$ to obtain the harmonic components of the digital feedback signal $D_{FB}$, and then the processing circuit 520 generates the at least one adjustment signal $S_{CTRL}$ according to the harmonic components. In an exemplary implementation of this embodiment, the processing circuit 520 includes a filter configured to filter the digital feedback signal $D_{FB}$ according to a parameter indicating the frequency of the digital input signal $D_{IN}$ and obtain the harmonic components of the digital feedback signal $D_{FB}$, and then the processing circuit 520 generates the at least one adjustment signal $S_{CTRL}$ according to the harmonic components.

Figure 6:
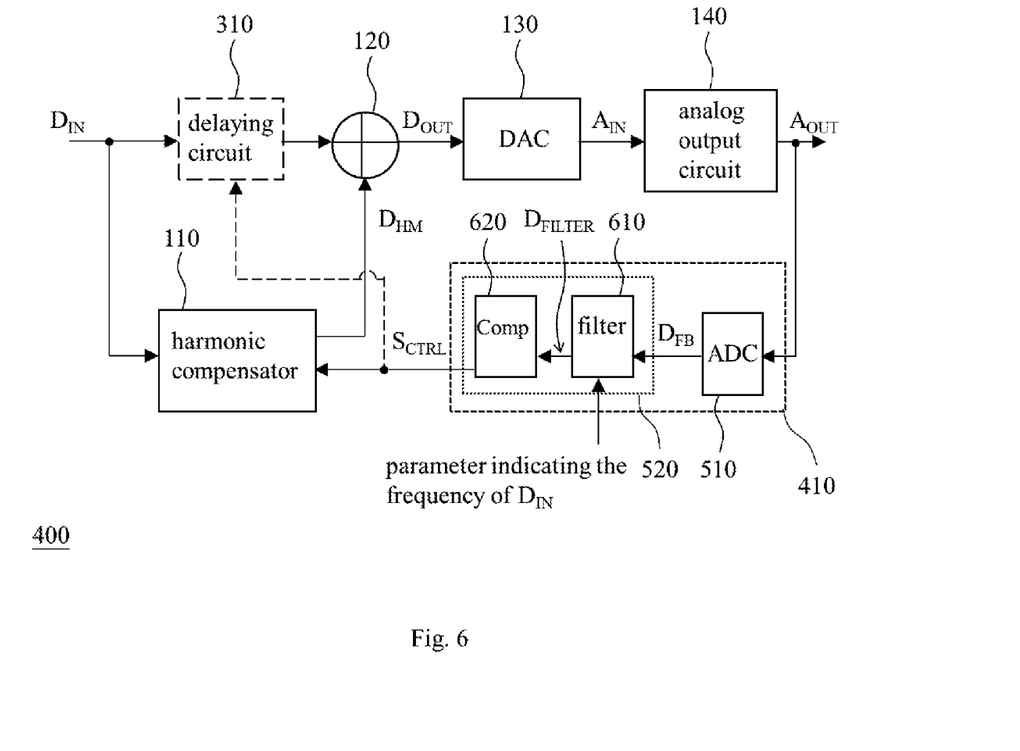
FIG. 6 shows an embodiment of the processing circuit of FIG. 5.

FIG. 6 shows an embodiment of the processing circuit 520 of FIG. 5. As shown in FIG. 6, the processing circuit 520 includes a filter 610 and a comparator 620 (Comp). The filter 610 is configured to filter the digital feedback signal $D_{FB}$ according to a parameter indicating the frequency of the digital input signal $D_{IN}$ and thereby generate a digital filtered signal $D_{FILTER}$; for instance, the filter 610 is configured to filter out non-harmonic components of the digital feedback signal $D_{FB}$, in which the frequency of the non-harmonic components is equal to the frequency of the digital input signal $D_{IN}$. The comparator 620 is configured to compare the strength of the digital filtered signal $D_{FILTER}$ with a predetermined threshold and thereby output at least one comparison result as the at least one adjustment signal $S_{CTRL}$. In an exemplary implementation of this embodiment, when the strength of the digital filtered signal $D_{FILTER}$ is stronger than the predetermined threshold, the at least one adjustment signal $S_{CTRL}$ can adaptively adjust the at least one parameter of the harmonic compensator 110 for further reduction of the strength of the digital filtered signal $D_{FILTER}$ (i.e., further reduction of the harmonic components of the digital feedback signal $D_{FB}$); and when the strength of the digital filtered signal $D_{FILTER}$ is not stronger than the predetermined threshold, the at least one adjustment signal $S_{CTRL}$ does nothing to the at least one parameter of the harmonic compensator 110.

Figure 7:
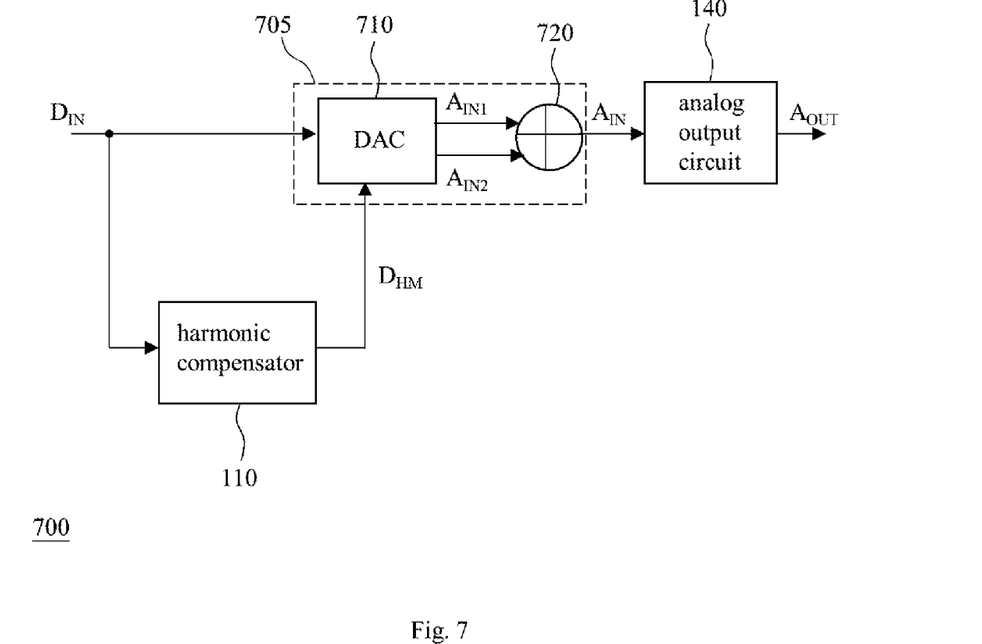
FIG. 7 shows a further embodiment of the harmonic compensation device of the present invention.

FIG. 7 shows another embodiment of the harmonic compensation device of the present invention. In comparison with FIG. 1, in the harmonic compensation device 700 of FIG. 7 the digital input signal $D_{IN}$ and the digital compensation signal $D_{HM}$ are inputted to a DAC 710 separately, a first DAC circuit of the DAC 710 generates a first analog input signal $A_{IN1}$ according to the digital input signal $D_{IN}$, a second DAC circuit of the DAC 710 generates a second analog input signal $A_{IN2}$ according to the digital compensation signal $D_{HM}$, and the mixer 720 generates the analog input signal $A_{IN}$ according to the first analog input signal $A_{IN1}$ and the second analog input signal $A_{IN2}$, in which the DAC 710 and the mixer 720 are included in a conversion circuit 705. Since people of ordinary skill in the art can appreciate the detail and modification of the embodiment of FIG. 7 according to the aforementioned embodiments, repeated and redundant description is omitted here.

It should be noted that people of ordinary skill in the art can implement the present invention by selectively using some or all of the features of any embodiment in this specification or selectively using some or all of the features of multiple embodiments in this specification as long as such implementation is practicable, which implies that the present invention can be carried out flexibly. It should also be noted that in addition to an operational amplifier, a non-linear operation of any other circuit (e.g., a multiplier) can induce harmonic components of an analog output signal; since the present invention determines the parameter setting of the harmonic compensator directly according to the harmonic components of the analog output signal, the harmonic components of the analog output signal can be offset or reduced regardless of its source.

To sum up, the present invention can generate a harmonic predistortion according to a digital input signal and thereby offset or reduce the harmonic distortion of an analog output signal generated according to the digital input signal.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:
1. A harmonic compensation device, comprising:
  a harmonic compensator configured to generate a digital compensation signal according to a digital input signal, in which the digital compensation signal includes harmonic components of the digital input signal;
  a conversion circuit configured to generate an analog input signal according to a delayed digital input signal and the digital compensation signal;

an analog output circuit configured to generate an analog output signal according to the analog input signal; and a delaying circuit configured to delay the digital input signal and thereby output the delayed digital input signal to the conversion circuit, wherein the delaying circuit receives a delay adjustment signal generated according to the analog output signal, and the delaying circuit is adjusted by the delay adjustment signal.

2. The harmonic compensation device of claim 1, wherein the conversion circuit includes:

a mixer configured to generate a digital output signal according to the digital input signal and the digital compensation signal; and a digital-to-analog converter configured to generate the analog input signal according to the digital output signal.

3. The harmonic compensation device of claim 1, wherein the conversion circuit includes:

a digital-to-analog converter configured to generate a first analog input signal according to the digital input signal and generate a second analog input signal according to the digital compensation signal; and a mixer configured to generate the analog input signal according to the first analog input signal and the second analog input signal.

4. The harmonic compensation device of claim 1, wherein the harmonic compensator includes:

a harmonic wave generator configured to generate K harmonic waves according to the digital input signal, in which a frequency of each of the K harmonic waves is N times a frequency of the digital input signal, the K is a positive integer, and the N is a positive value related to the harmonic wave type(s); and a gain adjusting circuit configured to adjust gains of the K waves and thereby generate K gain-adjusted harmonic waves, in which at least one parameter of the gain adjusting circuit is determined according to the analog output signal, in which the digital compensation signal is composed of the K gain-adjusted harmonic waves or composed of K phase-adjusted harmonic waves that are generated according to the K gain-adjusted harmonic waves.

5. The harmonic compensation device of claim 4, wherein the harmonic compensator includes:

a phase adjusting circuit configured to generate the K phase-adjusted harmonic waves according to the K gain-adjusted harmonic waves, in which the K phase-adjusted harmonic waves are treated as the digital compensation signal, and at least one parameter of the phase adjusting circuit is determined according to the analog output signal.

6. The harmonic compensation device of claim 5, wherein the at least one parameter of the phase adjusting circuit is determined according to the analog output signal and transmission delay caused by the harmonic compensator.

7. The harmonic compensation device of claim 5, further comprising:

a measuring circuit configured to measure harmonic distortion of the analog output signal and thereby generate a gain adjustment signal and a phase adjustment signal used for determining the at least one parameter of the gain adjusting circuit and the at least one parameter of the phase adjusting circuit respectively, wherein the harmonic compensation device is an integrated circuit.

8. The harmonic compensation device of claim 4, further comprising:

a measuring circuit configured to measure harmonic distortion of the analog output signal and thereby generate a gain adjustment signal and the delay adjustment signal used for determining the at least one parameter of the gain adjusting circuit and a delay amount of the delaying circuit respectively, wherein the harmonic compensation device is an integrated circuit.

9. The harmonic compensation device of claim 1, further comprising:

a measuring circuit configured to measure harmonic distortion of the analog output signal and thereby generate at least one adjustment signal used for determining at least one parameter of the harmonic compensator, wherein the harmonic compensation device is an integrated circuit.

10. The harmonic compensation device of claim 9, wherein the measuring circuit includes:

an analog-to-digital converter configured to generate a digital feedback signal according to the analog output signal; and a processing circuit configured to generate the at least one adjustment signal according to the digital feedback signal and the digital input signal.

11. The harmonic compensation device of claim 10, wherein the processing circuit includes:

a filter configured to filter the digital feedback signal according to a frequency of the digital input signal and thereby generate a digital filtered signal; and a comparator configured to compare a strength of the digital filtered signal with a predetermined threshold and thereby output at least one comparison result as the at least one adjustment signal.

12. The harmonic compensation device of claim 11, wherein the filter is configured to filter out non-harmonic components of the digital feedback signal, and a frequency of the non-harmonic components is equal to the frequency of the digital input signal.

13. The harmonic compensation device of claim 1, wherein the analog output signal is outputted to an external measuring device used for measurement of harmonic distortion of the analog output signal and determination of at least one parameter of the harmonic compensator, in which the external measuring device includes an analog-to-digital converter for converting the analog output signal into a digital feedback signal and a processing circuit for determining the at least one parameter of the harmonic compensator according to the digital feedback signal, and the external measuring device is not included in the harmonic compensation device.

14. The harmonic compensation device of claim 1, wherein at least one of the conversion circuit and the analog output circuit includes an electronic device working in a non-linear region and being a cause of harmonic distortion of the analog output signal.

15. The harmonic compensation device of claim 14, wherein the electronic device is an operational amplifier.

16. The harmonic compensation device of claim 1, wherein the digital input signal is a single-frequency signal.

17. The harmonic compensation device of claim 16, wherein the single-frequency signal is originated from a wireless communication device or an audio device.

* * * * *